United States Patent
Li et al.

(10) Patent No.: US 11,195,999 B2
(45) Date of Patent: Dec. 7, 2021

(54) PHASE CHANGE MATERIAL WITH REDUCED RESET STATE RESISTANCE DRIFT

(71) Applicant: International Business Machines Corporation, Armonk, NY (US)

(72) Inventors: Ning Li, White Plains, NY (US); Joel P. de Souza, Putnam Valley, NY (US); Stephen W. Bedell, Wappingers Falls, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 16/682,647

(22) Filed: Nov. 13, 2019

(65) Prior Publication Data
US 2021/0143325 A1    May 13, 2021

(51) Int. Cl.
*H01L 45/00* (2006.01)
*H01L 27/24* (2006.01)
*G01N 27/04* (2006.01)

(52) U.S. Cl.
CPC ......... *H01L 45/144* (2013.01); *G01N 27/041* (2013.01); *H01L 27/2409* (2013.01); *H01L 45/06* (2013.01); *H01L 45/1233* (2013.01); *H01L 45/1253* (2013.01); *H01L 45/1608* (2013.01); *H01L 45/1641* (2013.01)

(58) Field of Classification Search
None
See application file for complete search history.

(56) References Cited

U.S. PATENT DOCUMENTS

| | | |
|---|---|---|
| 7,787,278 B2 | 8/2010 | Bae et al. |
| 8,263,455 B2 | 9/2012 | Park et al. |
| 8,363,463 B2 | 1/2013 | Shih et al. |
| 8,946,666 B2 | 2/2015 | Cheng et al. |
| 9,171,616 B2 | 10/2015 | Liu et al. |
| 9,558,823 B1 | 1/2017 | Khwa et al. |
| 2006/0291364 A1 | 12/2006 | Kozicki |

(Continued)

FOREIGN PATENT DOCUMENTS

| | | | |
|---|---|---|---|
| DE | 102008038371 A1 | 2/2009 | |
| WO | WO-2015196412 A1 * | 12/2015 | ............. H01L 45/00 |

OTHER PUBLICATIONS

Kim et al., Characterization of Agx(Ge2Sb2Te5)1-x thin film by RF magnetron sputtering, Materials Characterization 58 (2007) 479-484 (Year: 2007).*

(Continued)

*Primary Examiner* — Andres Munoz
(74) *Attorney, Agent, or Firm* — Scully, Scott, Murphy & Presser, P.C.; Daniel P. Morris, Esq.

(57) ABSTRACT

A PCM cell is provided that includes a silver (Ag) doped $Ge_2Sb_2Te_5$ (GST) alloy layer as the PCM material. The PCM cell containing the Ag doped GST alloy layer exhibits a reduced reset state resistance drift as compared to an equivalent PCM cell in which a non-Ag doped GST alloy layer is used. In some embodiments and depending on the Ag dopant concentration of the Ag doped GST alloy layer, a constant reset state resistance or even a negative reset state resistance drift can be obtained.

14 Claims, 5 Drawing Sheets

(56) References Cited

U.S. PATENT DOCUMENTS

2007/0295948 A1* 12/2007 Lam .................. H01L 45/1233
257/4
2011/0049456 A1  3/2011 Lung et al.
2014/0034892 A1* 2/2014 Erbetta ................ H01L 45/06
257/2
2015/0028280 A1* 1/2015 Sciarrillo .............. H01L 45/06
257/4
2019/0363087 A1* 11/2019 Zhou .................. H01L 27/1085

OTHER PUBLICATIONS

Wang, L., et al., "Application of phase-change materials in memory taxonomy", Science and Technology of Advanced Materials, Accepted May 16, 2017 pp. 406-429, vol. 18, No. 1.

* cited by examiner

PHASE CHANGE MATERIAL WITH REDUCED RESET STATE RESISTANCE DRIFT

BACKGROUND

The present application relates to a memory cell, and more particularly to a phase change memory (PCM) cell that includes a PCM material that reduces the reset state resistance drift of the PCM cell during use.

Phase change memory (PCM) has emerged as a viable technology to fill the memory application gap between volatile memory and flash memory. PCM is a type of non-volatile random access memory (NVRAM). A NVRAM retains its information when the power is turned off. This is in contrast to dynamic random access memory (DRAM) and static random access memory (SRAM), which both maintain data only for as long as power is applied.

A typically PCM cell includes a material stack of a first electrode, a PCM material that exhibits a change in atomic order (from crystalline to amorphous, or vice versa), and a second electrode. For example, a PCM material composed of a germanium antimony tellurium ($Ge_2Sb_2Te_5$ or GST) alloy in the crystalline state presents a low resistance (i.e., the set state), while in the amorphous state a GST alloy presents a high resistance (i.e., reset state). In typical PCMs cells, the first and second electrodes are composed of a conductive material such as, for example, titanium nitride (TiN) or tungsten (W), while the PCM material is composed of a chalcogenide (i.e., a material that includes an element from Group 16 of the Periodic Table of Elements and a more electropositive element). Typically, a chalcogenide that provides the PCM material is GST.

One problem associated with PCM cells that include a chalcogenide such as GST is that the resistance of the cell in the reset state drifts over time. In general, PCM cells containing GST as the PCM material exhibit a positive reset state resistance drift coefficient (i.e., at the reset state the resistance increases over time). Reset state resistance drift can be especially problematic when the PCM cell is used as analog memory in neuromorphic computing. There is thus a need to provide a PCM cell in which the reset state resistance drift can be reduced.

SUMMARY

A phase change memory (PCM) cell is provided that includes a silver (Ag) doped $Ge_2Sb_2Te_5$ (GST) alloy layer as the PCM material. The PCM cell containing the Ag doped GST alloy layer exhibits a reduced reset state resistance drift as compared to an equivalent PCM cell in which a non-Ag doped GST alloy layer is used. In some embodiments and depending on the Ag dopant concentration of the Ag doped GST alloy layer, a constant reset state resistance or even a negative reset state resistance drift can be obtained.

In one aspect of the present application, a phase change memory (PCM) cell is provided. In one embodiment, the PCM cell includes a silver (Ag) doped $Ge_2Sb_2Te_5$ (GST) alloy layer sandwiched between a first electrode and a second electrode.

In another aspect of the present application, a structure is provided. In one embodiment, the structure includes a first electrically conductive metal-containing structure located on a surface of a substrate. A phase change memory (PCM) cell is located on the first electrically conductive metal-containing structure. The PCM cell includes a silver (Ag) doped $Ge_2Sb_2Te_5$ (GST) alloy layer sandwiched between a first electrode and a second electrode. A second electrically conductive metal-containing structure is located on the PCM cell.

In yet a further aspect of the present application, a Van der Pauw device is provided. The Van der Pauw device includes a silver (Ag) doped $Ge_2Sb_2Te_5$ (GST) alloy layer, and a metal-containing contact located at each corner of the silver (Ag) doped $Ge_2Sb_2Te_5$ (GST) alloy layer.

DETAILED DESCRIPTION

Figure 1:
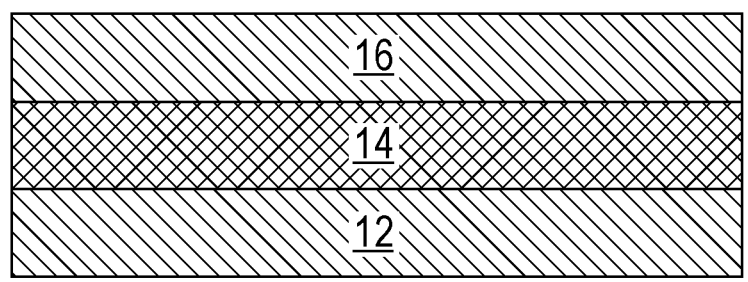
FIG. 1 is a cross sectional view of a phase change memory (PCM) material stack in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The Applicant of the present application has unexpectedly determined that the presence of a silver (Ag) doped $Ge_2Sb_2Te_5$ (GST) alloy as a PCM material can reduce the reset state resistance drift of a PCM cell as compared to an equivalent PCM cell in which a non-Ag doped GST alloy layer is used. The term "silver (Ag) doped $Ge_2Sb_2Te_5$ (GST) alloy" is used throughout the present application to denote a GST alloy in which Ag is present as an intentionally added impurity in a reset state resistance drift reducing amount as defined herein below which is sufficient to alter the original properties of the non-doped GST alloy. The Ag impurity, i.e., dopant, does not form a complex, or alloy, with the original GST alloy.

In the present application, the reset state resistance drift of a PCM cell can be determined by measuring the resistance of a PCM cell in the reset state over time, plotting such data in a graph of logarithm of resistance vs. logarithm of time, and thereafter calculating the slope of the plotted data.

Slope, sometimes referred to as gradient in mathematics, is a number that measures the steepness and direction of a line, or a section of a line connecting two points, and is usually denoted by m. The slope is essentially change in height over change in horizontal distance and is often referred to as "rise over run." The slope is represented mathematically as:

$$m = \frac{y_2 - y_1}{x_2 - x_1}$$

In the equation above, $y_2-y_1=\Delta y$, or vertical change in a graph, while $x_2-x_1=\Delta x$, or horizontal change in a graph. In the present application, $\Delta y$ is the change of logarithm of resistance, and $\Delta x$ is the change in logarithm of time.

The calculated slope provides a reset state resistance drift coefficient of a PCM cell. For a typical PCM cell including a non-Ag doped GST alloy as the PCM material that the reset state resistance drift coefficient is positive and is typically 0.1. For PCM cells including an Ag doped GST alloy PCM material, and in some embodiments, the reset state resistance drift coefficient is less than 0.05. The presence of the Ag doped GST alloy in a PCM cell thus provides a reduction in reset state resistance drift as compared to an equivalent PCM cell including a non-Ag doped GST alloy. In some embodiments, a 10 times or greater reduction in reset state resistance drift can be observed by replacing a non-Ag doped GST alloy with an Ag doped GST alloy. In some embodiments of the present application, the reset state resistance drift coefficient of the PCM cell can be zero (i.e., the reset state resistance is constant over time) or even negative depending on the Ag dopant concentration of Ag doped GST alloy material that is employed. These and other aspects of the present application will now be described in greater detail herein below.

Referring first to FIG. 1, there is illustrated a phase change memory (PCM) material stack 10 in accordance with an embodiment of the present application. The PCM material stack 10 shown in FIG. 1 includes a first electrode 12, a silver (Ag) doped $Ge_2Sb_2Te_5$ (GST) alloy layer 14, and a second electrode 16. As is shown, the Ag doped GST alloy layer 14 is sandwiched between the first electrode 12 and the second electrode 16.

In some embodiments, the Ag doped GST alloy layer 14 has a first surface that forms an interface with a surface of the first electrode 12 and a second surface, that is opposite the first surface, that forms an interface with the second electrode 16. In such an embodiment, the Ag doped GST alloy layer 14 directly contacts both the first electrode 12 and the second electrode 16.

The first electrode 12 is composed of a first conductive material. The first conductive material that provides the first electrode 12 can be a conductive metal, or a conductive metal nitride. In one embodiment of the present application, the first electrode 12 can be composed of titanium nitride (TiN), tantalum nitride (TaN) or tungsten (W). The first electrode 12 can have a thickness from 10 nm to 100 nm; although other thicknesses for the first electrode 12 are contemplated and can be employed in the present application. The first electrode 12 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

The Ag doped GST alloy layer 14, which is located between the first electrode 12 and the second electrode 16, is composed of GST alloy that contains silver (Ag) as an impurity (i.e., dopant) element. The silver impurity is present in the GST alloy in an amount sufficient to cause reduction of the reset state resistance drift of the PCM cell. In one embodiment of the present application, the Ag doped GST alloy layer 14 has a silver dopant concentration from 5 atomic percent silver to 15 atomic percent silver. In another embodiment of the present application, the Ag doped GST alloy layer has a silver dopant concentration from 10 atomic percent silver to 45 atomic percent silver. An Ag dopant concentration from 5 atomic percent to 45 atomic percent in a GST alloy causes reduction of the reset state resistance drift of a PCM cell.

In some embodiments, the Ag doped GST alloy layer 14 has a uniform silver dopant concentration from one surface of the Ag doped GST alloy layer 14 to an opposing surface of the Ag doped GST alloy layer 14. In other embodiments, the Ag doped GST alloy layer 14 has a graded silver dopant concentration. In some embodiments, the graded silver dopant concentration decreases inward from both an interface formed between the first electrode 12 and the Ag doped GST alloy layer 14 and from an interface formed between the second electrode 16 and the Ag doped GST alloy layer 14.

In one embodiment, the Ag doped GST alloy layer 14 can be formed by first forming a non-Ag doped GST alloy layer. The non-Ag doped GST alloy layer can be formed utilizing a deposition process such as chemical vapor deposition (CVD), plasma enhanced chemical vapor deposition (PECVD), atomic layer deposition (ALD), or physical vapor deposition (PVD). Next, Ag ions can be introduced into the non-Ag doped GST alloy layer utilizing ion implantation, gas phase doping or dopant diffusion from a sacrificial material layer.

In another embodiment, the Ag doped GST alloy layer 14 can be formed utilizing a deposition process in which Ag ions are introduced during the deposition process itself.

In yet another embodiment, the Ag doped GST alloy layer 14 can be formed by first depositing a first layer of silver, then depositing a non-Ag doped GST alloy layer, and thereafter depositing a second layer of silver. During the deposition of the various layers and due to thermal mixing, the Ag-doped GeST alloy layer 14 is formed; no separate Ag layer remains. In some embodiments, the first layer of silver can be omitted. In other embodiments, the second layer of silver can be omitted. The first layer of silver and/or the second layer of silver can be formed utilizing a deposition process including, for example, chemical vapor deposition (CVD), plasma enhanced chemical vapor deposition (PECVD), atomic layer deposition (ALD), physical vapor deposition (PVD), sputtering, chemical solution deposition or plating. The non-Ag doped GST alloy layer can be formed utilizing a deposition process such as chemical vapor deposition (CVD), plasma enhanced chemical vapor deposition (PECVD), atomic layer deposition (ALD), or physical vapor deposition (PVD). In one embodiment and when the first and second layers of silver are employed, the thickness of the first layer of silver and the second layer of silver can be from 3 nm to 15 nm, while the thickness of the non-Ag doped GST alloy layer can be from 20 nm to 150 nm.

The second electrode 16 is composed of a second conductive material. The second conductive material that provides the second electrode 16 can be a conductive metal, or a conductive metal nitride. In one embodiment of the present application, the second electrode 16 can be composed of titanium nitride (TiN), tantalum nitride (TaN) or tungsten (W). In some embodiments, the second conductive material is a compositionally same conductive material as the first conductive material. In one example, both the first electrode 12 and the second electrode 16 are composed of titanium nitride (TiN). In other embodiments, the second conductive material is a compositionally different conductive material than the first conductive material. In one example, the first electrode 12 is composed of titanium nitride (TiN), and the second electrode 16 is composed of tantalum nitride (TaN). The second electrode 16 can have a thickness from 10 nm to 100 nm; although other thicknesses for the second electrode 16 are contemplated and can be employed in the present application. The second electrode 16 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

In some embodiments, the PCM material stack 10 can be formed by providing a material stack of blanket deposited layers of the first electrode 12, the Ag doped GST alloy layer 14, and the second electrode 16 and then subjecting the material stack to a patterning process such as, for example, lithography and etching. In other embodiments, the PCM material stack can be formed by providing a dielectric material layer (not shown), forming an opening in the dielectric material layer, and then forming the PCM material stack 10 in the opening formed in the dielectric material layer. In some embodiments, the dielectric material layer is an interconnect dielectric material that is found in the back-end-of the-line (BEOL).

Figure 2:
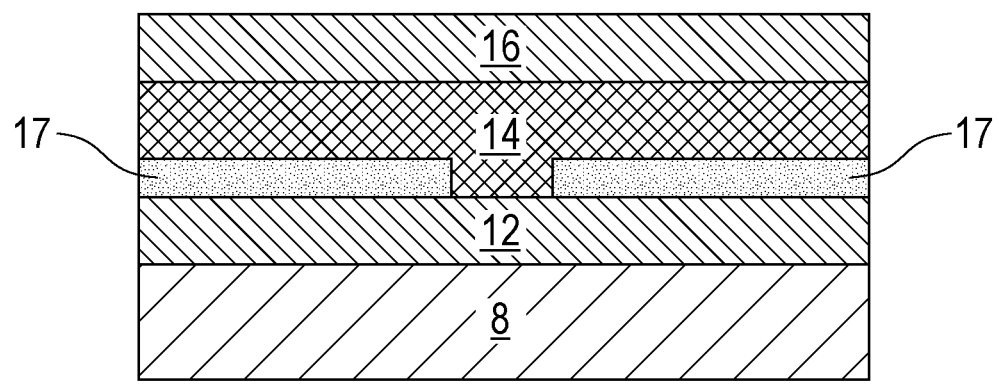
FIG. 2 is a cross sectional view of a PCM cell that includes the PCM material stack shown in FIG. 1.

The PCM material stack 10 shown in FIG. 1 can be used in various PCM cells that are well known to those skilled in the art. The PCM cell can be present in the front end-of-the-line (FEOL) or in the back-end-of-the-line (BEOL). FIG. 2 illustrates a PCM cell 15 that includes the PCM material stack 10 of FIG. 1. The PCM cell 15 of FIG. 2 includes a substrate 8 that is composed of one or more semiconductor materials having semiconductor properties (such as, for example, silicon), a first electrode 12, as defined above, a patterned dielectric material layer 17 such as, for example, silicon dioxide or silicon nitride, a Ag doped GST alloy layer 14, as defined above, and a second electrode 16, as defined above. The PCM cell 15 shown in FIG. 2 is present in the FEOL, and the PCM cell 15 can be formed utilizing techniques that are well known to those skilled in the art.

Figure 3:
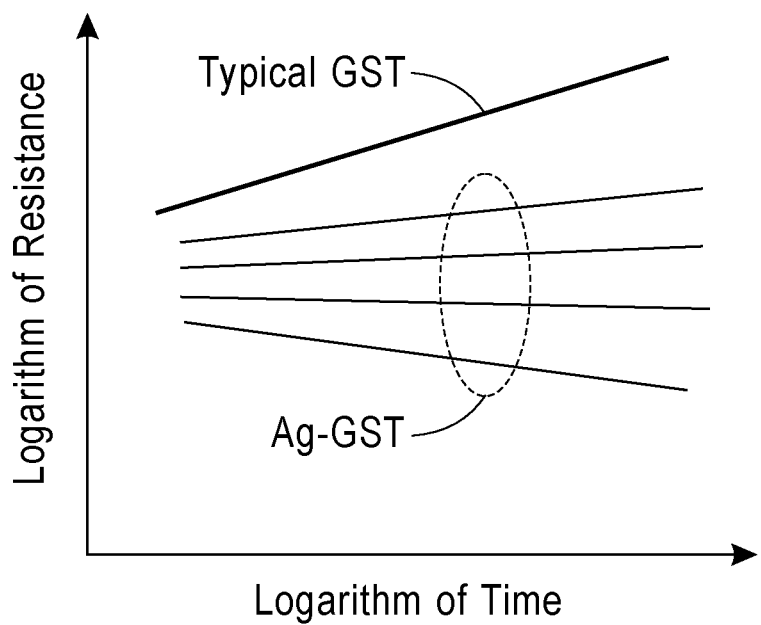
FIG. 3 is a graph of logarithm of resistance vs. logarithm of time showing the observed reset state resistance drift behavior for a prior art PCM cell containing GST as the PCM material and for PCM cells containing Ag doped GST and in accordance with the present application.

Referring now to FIG. 3, there is illustrated a graph of logarithm of resistance vs. logarithm of time showing the observed reset state resistance drift behavior for a prior art PCM cell containing GST as the PCM material and for PCM cells containing Ag doped GST and in accordance with the present application; the PCM cells are identical except for the PCM material. This graph clearly shows that the typical GST-containing PCM material present in the prior art PCM cell has a positive reset state resistance drift over time, while the PCM cells containing Ag-GST containing PCM material have a decreased reset state resistance drift over time. Depending on the Ag dopant concentration of the Ag doped GST, the PCM cell may exhibit a positive, yet reduced reset state resistance drift, a constant, yet reduced reset state resistance drift, or a negative yet reduced, reset state resistance drift.

Figure 4:
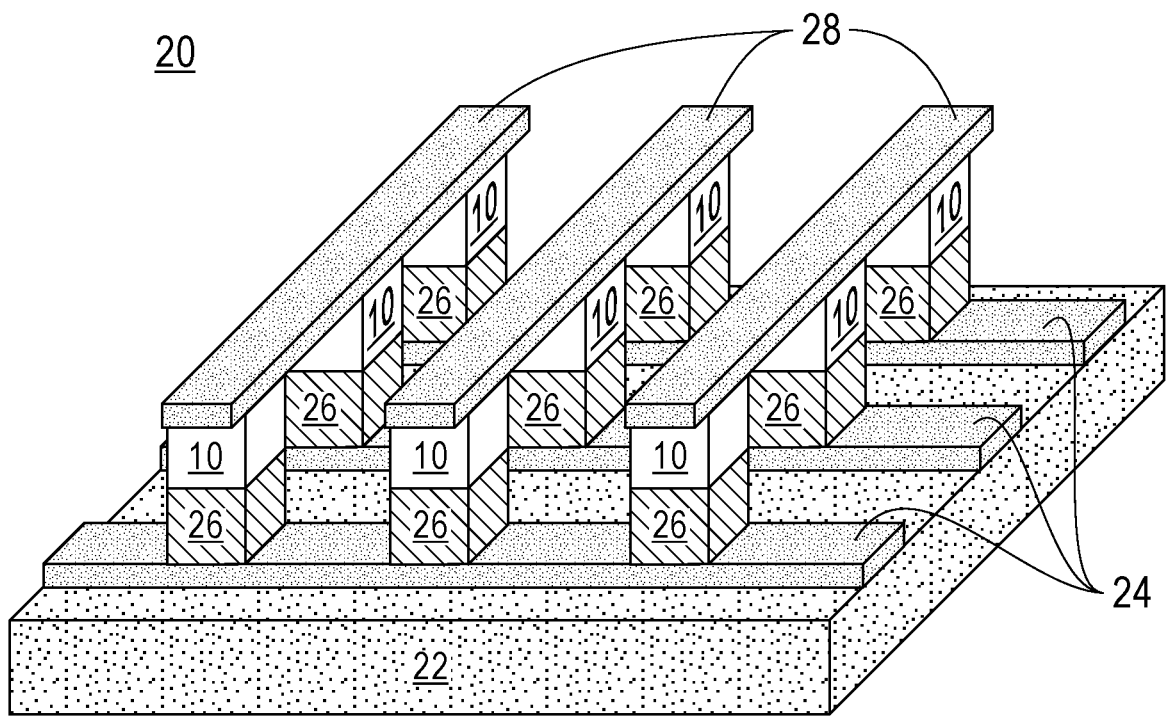
FIG. 4 is a three dimensional representation of a structure including a PCM cell in accordance with the present application located between a first electrically conductive metal containing structure and a second electrically conductive metal-containing structure.

Referring now to FIG. 4, there is illustrated a structure 20 including a PCM material stack 10 in accordance with the present application located between a first electrically conductive metal-containing structure 24 and a second electrically conductive metal-containing structure 28. Notably, FIG. 4 shows an array of PCM material stacks 10 that are located between a plurality of first electrically conductive metal-containing structures 24 and a plurality of second electrically conductive metal-containing structures 28. In some embodiments, the structure 20 is a BEOL compatible PCM cross-point memory structure that can be used in various applications, including, for example, neuromorphic computing.

Each first electrically conductive metal-containing structure 24 can be composed of a first electrically conductive metal or first electrically conductive metal alloy. In one embodiment, each first electrically conductive metal-containing structure 24 can be composed of copper (Cu), aluminum (Al), tungsten (W), cobalt (Co) or a copper-aluminum alloy.

Each second electrically conductive metal-containing structure 28 can be composed of a second electrically conductive metal or second electrically conductive metal alloy. In one embodiment, each second electrically conductive metal-containing structure 28 can be composed of copper (Cu), aluminum (Al), tungsten (W), cobalt (Co) or a copper-aluminum alloy. Each second electrically conductive metal-containing structure 28 can be composed of an electrically conductive material that is compositionally the same as, or compositionally different from, each first electrically conductive metal-containing structure 24.

In the illustrated embodiment of FIG. 4, each of the second electrically conductive metal-containing structures 28 is oriented perpendicular to the first electrically conductive metal-containing structures 24. In one embodiment, each of the second electrically conductive metal-containing structures 28 is a bit line of the structure, and each of the first electrically conductive metal-containing structures 24 is a word line of the structure. Each PCM material stack 10 includes a Ag doped $Ge_2Sb_2Te_5$ alloy layer 14, as defined above, sandwiched between a first electrode 12, as defined above, and a second electrode 16, as defined above. For clarity and in FIG. 4, the first electrode 12, the Ag doped Ge$_2$Sb$_2$Te$_5$ alloy layer 14, and the second electrode 16 are collectively shown as PCM material stack 10.

As is shown, the first electrically conductive metal-containing structure 24 is located on a surface of substrate 22. In one embodiment, substrate 22 includes a front-end-of-the-line (FEOL) level that contains one or more semiconductor devices located on, or in, a semiconductor substrate. In another embodiment, substrate 22 includes a back-end-of-the line (BEOL) level located on a FEOL level. The BEOL level includes one or more interconnect levels that contain an interconnect dielectric material having one or more electrically conductive structures embedded therein.

In some embodiment, structure 20 may also include a selector-containing layer 26 located between each first electrically conductive metal-containing structure 26 and each PCM cell 10. Each selector-containing layer 26 includes, for example, a diode or a threshold switching device. In some embodiments, selector-containing layer 26 can be omitted from structure 20.

The structure 20 shown in FIG. 4 can be formed utilizing processing techniques that are well known to those skilled in the art except for PCM material 10 which is formed as described above using Ag doped GST as the PCM material. Although not shown, the structure 20 can be embedded in one or more interconnect dielectric material layers that are formed upon substrate 22.

Figure 5:
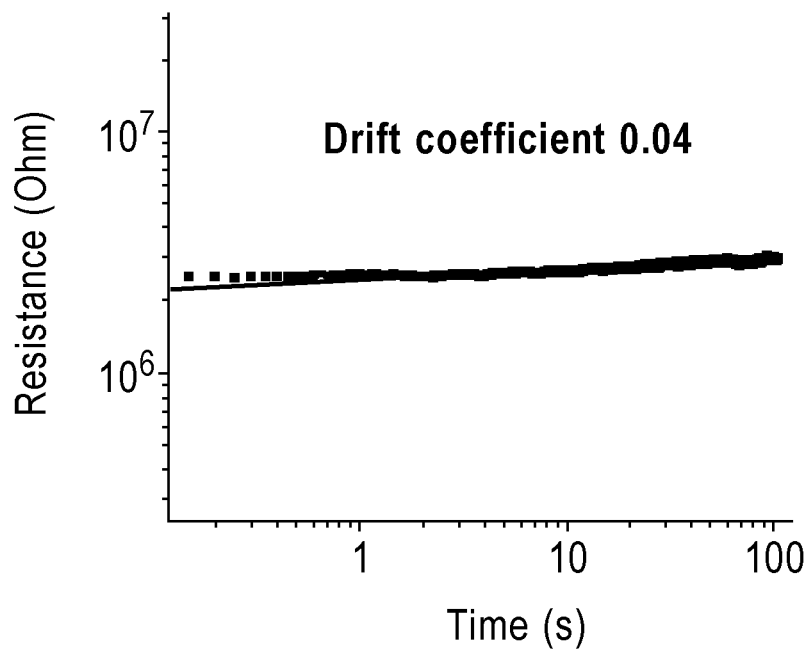
FIG. 5 is a graph of reset state resistance vs. time for a prior art PCM cell containing GST as the PCM material.

Referring now to FIG. 5, there is shown an actual graph of reset state resistance vs. time for a prior art PCM cell containing GST as the PCM material. The prior art PCM cell was similar to the PCM cell shown in FIG. 2 except that GST was used instead of Ag doped GST layer 14; the actual cell included silicon as substrate 8, TiN as the first electrode 12, silicon nitride as patterned dielectric material layer 17, GST as the PCM material (in place of Ag doped GST material layer 14), TaN as the second electrode 16. The GST material of the prior art PCM cell that generated the graph shown in FIG. 5 contained no silver dopant. The size of the contact area of the prior art PCM cell was 0.2 micron by 0.2 micron, and the reset state resistance data was obtained by electrical measurement at 0.2 volts. The prior art PCM cell containing GST as the PCM material had a positive reset state resistance drift and a calculated reset state resistance drift coefficient of 0.04.

Figure 6:
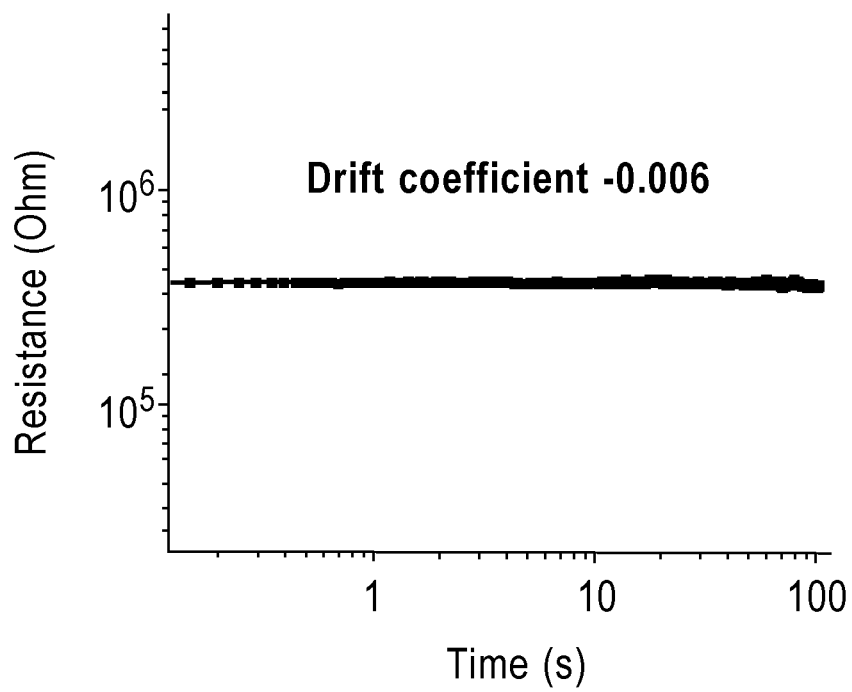
FIG. 6 is a graph of reset state resistance vs. time for a PCM cell containing Ag doped GST as the PCM material and in accordance with the present application.

Referring now to FIG. 6, there is shown an actual graph of reset state resistance vs. time for a PCM cell containing Ag doped GST as the PCM material and in accordance with the present application. The PCM cell is as shown in FIG. 2 and included silicon as substrate 8, TiN as the first electrode 12, silicon nitride as patterned dielectric material layer 17, Ag doped GST material layer 14, TaN as the second electrode 16. In this example, the silver dopant concentration of the Ag doped GST material was about 15 atomic percent silver. The contact size of the PCM cell was 0.2 micron by 0.2 micron, and the rests state resistance data was obtained by electrical measurement at 0.2 volts. The PCM cell containing Ag doped GST as the PCM material had a slightly negative reset state resistance drift and a calculated reset state resistance drift coefficient of −0.006.

Figure 7A:
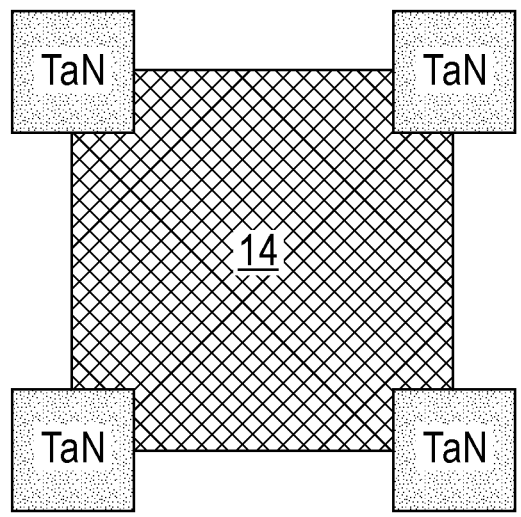
FIG. 7A is top down view of a Van der Pauw device that can be employed in the present application illustrating an Ag doped GST material and TaN top contacts.
Figure 7B:
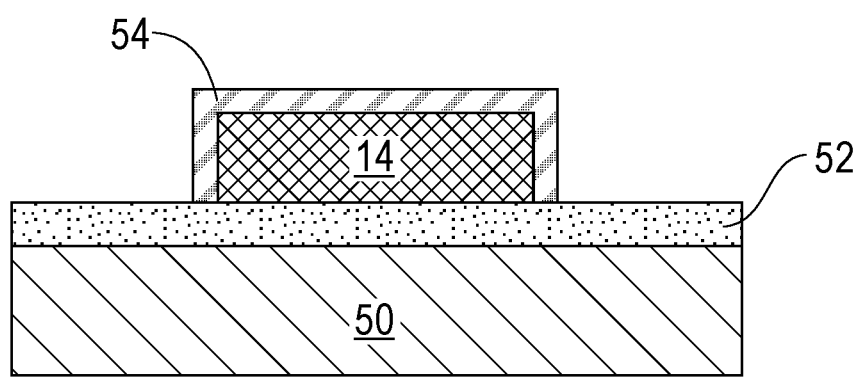
FIG. 7B is a cross sectional view of a Van der Pauw device without the top contacts and including a Si substrate, a first dielectric material composed of silicon dioxide, a Ag doped GST layer, and a second dielectric material composed of silicon nitride.

In some embodiments of the present application, a Van der Pauw device such as shown in FIGS. 7A and 7B was employed to measure the reset state resistance drift of the phase change material The Van der Pauw device included a Si substrate 50, a first dielectric material 52 composed of silicon dioxide, a Ag doped GST alloy layer 14, and a second dielectric material 54 composed of silicon nitride. The Van der Pauw device included TaN contacts as shown in FIG. 7A. Other metal containing contact materials can be used in place of TaN contacts.

In the present application, the Van der Pauw device was formed by providing a 250 nm thick Ag doped GST film, covering an area of 5 mm by 5 mm. For electrical insulation, the Ag doped GST was deposited on 100 nm thick SiO$_2$ insulating layer, grown on a silicon wafer. In each corner of the Ag doped GST film there was a sputter deposited 100 nm thick TaN films, patterned to square shape of 3 mm×3 mm, partially overlapping the Ag doped GST. The TaN films provided ohmic contact to Ag doped GST for the electrical measurements to obtain the sheet resistance. For protection against atmospheric contamination the Ag doped GST film was covered with 100 nm thick Si$_3$N$_4$ film deposited by sputtering. The device was annealed at 150° C. for 15 min in a N$_2$ atmosphere. This anneal did not crystallized the Ag doped GST (the Ag doped GST crystallization occurs at around 300° C.). A test Van der Pauw device was prepared utilizing non-Ag doped GST instead of Ag doped GST.

Figure 8:
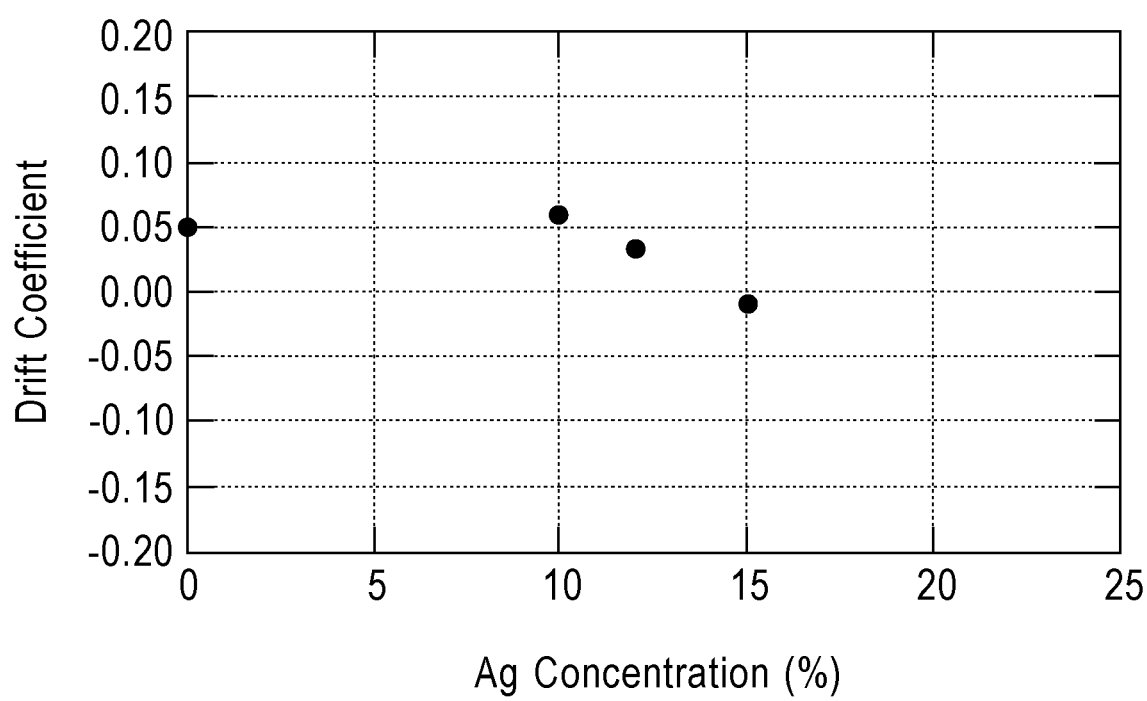
FIG. 8 is an actual graph of the reset state resistance drift coefficient vs. silver dopant concentration in atomic percent for various Van der Pauw devices containing Ag doped GST and in accordance with the present application.

Referring now to FIG. 8, there is shown actual graph of the reset state drift coefficient vs. silver dopant concentration in atomic percent for various Van der Pauw devices containing Ag doped GST and in accordance with the present application. In FIG. 8, the Ag dopant concentration within the Ag doped GST material was varied to show that the Ag dopant concentration affects the reset state resistance drift. In FIG. 8, the silver dopant concentration of the Ag doped GST material was about 0 atomic percent silver to about 20 atomic percent silver. At zero atomic percent silver, a non-Ag doped GST alloy was employed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A phase change memory (PCM) cell comprising:
a silver (Ag) doped Ge$_2$Sb$_2$Te$_5$ (GST) alloy layer sandwiched between a first electrode and a second electrode, wherein the Ag doped GST alloy layer has a graded silver dopant concentration that decreases inward from both an interface formed between the first electrode and the Ag doped GST alloy layer and from an interface formed between the second electrode and the Ag doped GST alloy layer.

2. The PCM cell of claim 1, wherein the Ag doped GST alloy layer has a silver dopant concentration from 5 atomic percent silver to 15 atomic percent silver.

3. The PCM cell of claim 1, wherein the Ag doped GST alloy layer has a silver dopant concentration from 10 atomic percent silver to 45 atomic percent silver.

4. The PCM cell of claim 1, wherein the first electrode is composed of a first conductive material and the second electrode is composed of a second conductive material, wherein the first conductive material is a compositionally same conductive material as the second conductive material.

5. The PCM cell of claim 1, wherein the first electrode is composed of a first conductive material and the second electrode is composed of a second conductive material, wherein the first conductive material is a compositionally different conductive material than the second conductive material.

6. The PCM cell of claim 1, wherein the PCM cell has a reset state resistance drift coefficient of less than 0.05.

7. A structure comprising:
   a first electrically conductive metal-containing structure located on a surface of a substrate;
   a phase change memory (PCM) cell located on the first electrically conductive metal-containing structure, wherein the PCM cell comprises a silver (Ag) doped $Ge_2Sb_2Te_5$ (GST) alloy layer sandwiched between a first electrode and a second electrode; and
   a second electrically conductive metal-containing structure located on the PCM cell, wherein the Ag doped GST alloy layer has a graded silver dopant concentration that decreases inward from both an interface formed between the first electrode and the Ag doped GST alloy layer and from an interface formed between the second electrode and the Ag doped GST alloy layer.

8. The structure of claim 7, wherein the substrate comprises a front-end-of-the-line (FEOL) level.

9. The structure of claim 8, wherein the substrate further comprises a back-end-of-the line (BEOL) level located on the FEOL level.

10. The structure of claim 7, further comprising a selector-containing layer located between the first electrically conductive metal-containing structure and the PCM cell.

11. The structure of claim 10, wherein the selector-containing layer comprises a diode or a threshold switching device.

12. The structure of claim 7, wherein the Ag doped GST alloy layer has a silver dopant concentration from 5 atomic percent silver to 15 atomic percent silver.

13. The structure of claim 7, wherein the Ag doped GST alloy layer has a silver dopant concentration from 10 atomic percent silver to 45 atomic percent silver.

14. The structure of claim 7, wherein the PCM cell has a reset state resistance drift coefficient of less than 0.05.

\* \* \* \* \*